(12) United States Patent
Feng

(10) Patent No.: US 8,312,345 B1
(45) Date of Patent: Nov. 13, 2012

(54) FORWARD ERROR CORRECTING CODE ENCODER APPARATUS

(75) Inventor: Weishi Feng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1433 days.

(21) Appl. No.: 11/862,729

(22) Filed: Sep. 27, 2007

Related U.S. Application Data

(60) Provisional application No. 60/827,548, filed on Sep. 29, 2006.

(51) Int. Cl.
*H03M 13/00* (2006.01)
*G06F 11/00* (2006.01)

(52) U.S. Cl. .................................. 714/755; 714/746

(58) Field of Classification Search ................ 714/755, 714/786, 791, 784, 746, 752, 757, 781, 782, 714/783, 785, 758; 370/252
See application file for complete search history.

(56) References Cited

U.S. PATENT DOCUMENTS

| | | | |
|---|---|---|---|
| 5,257,380 A | 10/1993 | Lang | |
| 5,872,798 A * | 2/1999 | Baggen et al. | 714/755 |
| 5,898,710 A * | 4/1999 | Amrany | 714/786 |
| 5,968,200 A * | 10/1999 | Amrany | 714/786 |
| 6,131,159 A | 10/2000 | Hecht et al. | |
| 6,405,339 B1 * | 6/2002 | Cox et al. | 714/756 |
| 7,051,267 B1 | 5/2006 | Yu et al. | |
| 7,127,664 B2 * | 10/2006 | Nicol et al. | 714/792 |
| 7,475,174 B2 * | 1/2009 | Chow et al. | 710/74 |
| 7,509,564 B2 * | 3/2009 | Dohmen et al. | 714/782 |
| 7,958,426 B2 * | 6/2011 | Betts | 714/755 |
| 8,069,388 B2 * | 11/2011 | Betts | 714/755 |
| 2003/0101406 A1 * | 5/2003 | Song | 714/774 |
| 2005/0210353 A1 * | 9/2005 | Dohmen et al. | 714/746 |
| 2006/0013168 A1 * | 1/2006 | Agrawal et al. | 370/335 |
| 2009/0100307 A1 * | 4/2009 | Lee | 714/746 |

OTHER PUBLICATIONS

Troung et al., "Inversionless Decoding of Both Errors and Erasures of Reed-Solomon Code," *IEEE Transactions on Communications* 46(8), pp. 973-976, Aug. 1998.

Chien, "Cyclic Decoding Procedures for Bose-Chaudhuri-Hocquenghem Codes," *IEEE Transaction on Information Theory*, pp. 357-363, Oct. 1964.

Forney, Jr., "On Decoding BDH Codes," *IEEE Transactions on Information Theory*, pp. 549-557, Oct. 1965.

"Chapter 5: Generalized Reed-Solomon Codes," excerpted from J. I. Hall, *Notes on Coding Theory*, Michigan State University, pp. 63-76, Jan. 2003.

"Reed-Solomon Codes," excerpted from Bernard Sklar, *Digital Communications: Fundamentals and Applications*, pp. 1-33, 2d ed. ,Prentice-Hall Jan. 2001.

Chang et al., "Universal Architectures for Reed-Solomon Error-and-Erasure Decoder," IEEE *Asian Solid-State Circuits Conference*, pp. 229-232, Nov. 2005.

\* cited by examiner

*Primary Examiner* — Phung M Chung

(57) ABSTRACT

In an error correcting code encoder apparatus, a first processor generates a first subset of codeword symbols based on original symbols. The first processor includes a first serial input to receive a first subset of the original symbols. A second processor generates a second subset of the codeword symbols based on the original symbols. The second processor includes a second serial input to receive a second subset of the original symbols.

16 Claims, 9 Drawing Sheets

PRIOR ART

FORWARD ERROR CORRECTING CODE ENCODER APPARATUS

CROSS-REFERENCES TO RELATED APPLICATIONS

The present application claims the benefit of U.S. Provisional Application No. 60/827,548, entitled "An Architecture for Reed-Solomon Code Encoder and Decoder that Processes Two Symbols Each Clock Cycle," filed on Sep. 29, 2006, which is hereby incorporated by reference herein in its entirety.

FIELD OF THE DISCLOSURE

The present invention relates generally to error correction systems and, more particularly, to error correcting code encoders and decoders.

BACKGROUND

As data storage densities and data transmission rates increase, the ability of hardware devices to correctly recognize binary data diminishes. To ensure data integrity, an error correcting code (ECC) is often used. Many communications systems and data storage systems perform forward error correction (FEC) to improve data transmission accuracy and to ensure data integrity. FEC helps reduce error rates in applications such as data storage, digital video broadcasts, and wireless communications. One type of ECC used for FEC is referred to as error correcting block codes. Block codes are applied to fixed-size blocks of bits or symbols of predetermined size. Examples of block codes include Reed-Solomon (RS), Golay, Bose, Chaudhuri and Hocquenghem (BCH), and Hamming ECC's.

Error correcting block codes may be used in any system in which a first device communicates with a second device via a communications channel. The communications channel can be hardwired or wireless. For example, the communications channel can include one or more of a wireless point-to-point communications link, a wired point-to-point communications link, a wide area network, a local area network, a wireless local area network, a bus, etc. Also, the communications channel could include a storage device having, for example a magnetic storage medium, an optical storage medium, etc. For instance, the first device could be a write channel of a hard disk drive and the second device could be a read channel.

The first device may include an ECC encoder and the second device may include an ECC decoder. The ECC encoder encodes the data before the data is output onto the communications channel. Generally speaking, the ECC encoder inserts redundant symbols into the data. The ECC decoder uses the redundant symbols to detect and, when possible, to correct errors in the received data.

As mentioned above, RS codes are examples of error correcting block codes. The error-correcting ability of any RS code is determined by n−k, the measure of redundancy in the block, where n is the total number of symbols in the block and k is the number of original data symbols. If the locations of the symbols in error are not known in advance, then an RS code can correct up to $t=(n-k)/2$ erroneous symbols. It is noted that the number of redundant symbols in the block is 2t.

Sometimes error locations are known in advance (e.g., "side information" in demodulator signal-to-noise ratios)—these may be referred to as erasures. An RS code is able to correct twice as many erasures as errors, and any combination of errors and erasures can be corrected as long as the inequality $2E+S \leq n-k$ is satisfied, where E is the number of errors and S is the number of erasures in the block.

Given a symbol size s (in bits), the maximum codeword length (n) for an RS code is $n=2^s-1$. For example, the maximum length of a code with 8-bit symbols (s=8) is 255 bytes.

RS codes are computed based on Galois field or finite field mathematics. A finite field has the property that arithmetic operations (+, −, ×, /, etc.) on field elements always have a result that is also an element the field. An RS encoder or decoder implements these finite field arithmetic operations.

The properties of Reed-Solomon codes make them especially well-suited to applications where errors occur in bursts because it does not matter to the code how many bits in a symbol are in error—if multiple bits in a symbol are corrupted it only counts as a single error. Conversely, if a data stream is not characterized by error bursts or drop-outs but by random single bit errors, a Reed-Solomon code may not be an optimum choice of ECC.

An RS codeword is generated based on a polynomial referred to as a generator polynomial. In particular, the generator polynomial may be used to generate the redundant symbols for a codeword based on a block of original symbols. The general form of the generator polynomial g(x) is:

$$g(X)=(X-\alpha^0)(X-\alpha^1)\ldots(X-\alpha^{2t-1})$$ Equ. 1 where X is a variable in the finite field, and $\alpha^i$, for i=0, 2, ..., 2t−1, are the roots of the generator polynomial. The generator polynomial also can be represented as:

$$g(X)=g_0+g_1X+g_2X^2+\ldots g_{2t-1}X^{2t-1}+X^{2t}$$ Equ. 2 where $g_k$, for k=0, 2, ..., 2t−1, are the coefficients of the generator polynomial.

RS codes are systematic codes, meaning the codeword includes the original message symbols. FIG. 1 is a diagram illustrating an example RS codeword 10 that includes a message portion 12 and a redundant portion 14. The message portion 12 may be represented as a message polynomial m(X), and the redundant portion 14 may be represented as a parity polynomial p(X). The codeword may be represented as a codeword polynomial U(X), where:

$$U(X)=p(X)+X^{n-k}m(X)$$ Equ. 3

The parity polynomial p(X) (i.e., the redundant symbols) can be determined by dividing $X^{n-k}m(X)$ by the generator polynomial g(X). In particular, the parity polynomial p(X) is the remainder of such a division, and can be expressed as:

$$p(X)=X^{n-k}m(X) \bmod g(X)$$ Equ. 4

FIG. 2 is a block diagram of a prior art RS encoder 50. The encoder 50 includes a multiplexer 54 and a multiplexer 58. Additionally, the encoder 50 includes 2t finite field multipliers 62, 64, and 2t finite field adders 68, 70. Additionally, the encoder 50 includes 2t registers 74, 76, 78 that are coupled in series. The multiplexer 54 includes a first input that receives the k original symbols $d_0, d_1, \ldots, d_{k-2}, d_{k-1}$ in sequential order, starting with $d_0$. During calculation of the parity symbols, each original symbol is added with an output of the register 74 and the result is provided as feedback to the registers 74, 76. In particular, for each register 74, 76, 78 the feedback is multiplied by a corresponding coefficient of the generator polynomial. Also, except for the register 78, the output of the multiplier 62, 64 is added with the output of the previous register 76, 78 and then loaded into the register 74, 76. With respect to the register 78, it is loaded with the output of the multiplier 62. Each of the registers 74, 76, 78 includes a clock input which is coupled to a clock signal (not shown).

In operation, the encoder 50 iteratively generates the values of the 2t redundant symbols, and the updated values of the redundant symbols are stored in the registers 74, 76, 78. Initially, the contents of the registers 74, 76, 78 are cleared to zero. Also, the multiplexer 54 is controlled so that its first input is selected. Further, the multiplexer 58 is controlled so that the output of the adder 68 is selected as its output. During a first clock cycle, the symbol $d_0$ is provided to the adder 68, and the output of the adder 68 is operated on by the multipliers 62, 64 and the adders 70. Also, the outputs of the adders 70, when ready, are loaded into the registers 74, 76. Additionally, the output of the multiplier 62 is loaded into the register 78. Similarly, during the subsequent k−1 clock cycles, the remainder of the symbols $d_1, \ldots, d_{k-2}, d_{k-1}$ are provided to the adder 58 and results loaded into the registers 74, 76, 78. Thus, during the first k clock cycles, the original symbols appear at the output of the multiplexer 54 and are fed back to the multipliers 62, 64.

The calculations associated with each of the registers 74, 76, 78 can be represented as:

$$r_i^{j+1} = r_{i-1}^j + (d_j + r_{2t-1}^j) g_i \qquad \text{Equ. 5}$$

where $r_i^{j+1}$ corresponds to the value of the i-th register 74, 76 at the (j+1)-th clock cycle, $r_{i-1}^j$ corresponds to the value of the (i−1)-th register 76, 78 at the j-th clock cycle, $r_{2t-1}^j$ corresponds to the value of the register 74 at the j-th clock cycle, values of r with negative subscripts and/or negative superscripts are zero, and values of d with negative subscripts are zero. In other words, the value of the i-th redundant symbol at the (j+1)-th iteration ($r_i^{j+1}$) is based on the (i−1)-th redundant symbol at the j-th iteration ($r_{i-1}^j$) and the (2t−1)-th redundant symbol at the j-th iteration ($r_{2t-1}^j$).

After all of the k original symbols $d_0, d_1, \ldots, d_{k-2}, d_{k-1}$ have been operated upon (i.e., after k clock cycles), the 2t redundant symbols are stored in the registers 74, 76, 78. The multiplexer 58 then may be controlled to select its second input, which is coupled to the output of the register 74, as its output. Also, the multiplexer 58 may be controlled to route a zero value to the multipliers 62, 64.

Then, during the next 2t=n−k clock cycles, the 2t redundant symbols are shifted out of the registers 74, 76, 78 and appear at the output of the multiplexer 54.

In the communication channel, one or more of the symbols of a codeword may become corrupted. An RS decoder seeks to correct these errors if possible. Typically, an RS decoder first computes syndrome values for the received codeword. Generally speaking, a syndrome (which includes 2t=n−k syndrome values) is a result of a parity check operation performed on the received codeword to determine if the received codeword is a valid codeword corresponding to the generator polynomial. If all of the syndrome values are zero, then the received codeword is a valid codeword, and there are no errors. If one or more of the syndrome values are non-zero, on the other hand, this indicates that the received codeword is not a valid codeword and that there are one or more errors.

The RS decoder also computes an error locator polynomial based on the syndrome values. The error locator polynomial generally indicates which of the symbols in the received codeword are in error. The error locator polynomial can be calculated using a variety of techniques including a Berlekamp-Massey algorithm (BMA), an inversionless BMA (iBMA) such as described in T. K. Truong et al., "Inversionless Decoding of Both Errors and Erasures of Reed-Solomon Code", I.E.E.E. Transactions on Communications, Vol. 46, No. 8, August 1998), a Euclidean algorithm, Chien's search technique described in R. T. Chien, "Cyclic Decoding Procedure for the Bose-Chandhuri-Hocquenghem Codes", I.E.E.E. Transactions on Information Theory, Vol. IT-10, pp. 357 363, October 1964, etc.

Next, the RS decoder may compute an error evaluator polynomial that may be used to correct the detected errors in the received codeword. The error evaluator polynomial is calculated based on the syndrome values and the error locator polynomial using any of a variety of techniques such as Formey's algorithm disclosed in G. D. Formey, "On Decoding BCH Codes", I.E.E.E Transactions on Information Theory, Vol. IT-11, pp. 549 557, October 1965. Finally, the RS decoder corrects the received codeword using the error evaluator polynomial.

FIG. 3 is a block diagram of a prior art syndrome calculator 100. The syndrome calculator 100 includes 2t finite field adders 104 registers 104 and 2t finite field multiplies 108. Additionally, the syndrome calculator 100 includes 2t registers 112, each having a clock input coupled to a clock signal (not shown). In operation, the registers 112 are initially cleared to zero. Then, symbols of a received codeword $v_0, v_1, \ldots, v_{n-1}$ are provided to the syndrome calculator 100 in sequential order, one symbol per clock cycle, starting with $v_{n-1}$. During each clock cycle, the output of each register 112 is multiplied with a corresponding root $\alpha^i$ of the generator polynomial g(X) (i=0, 2, ..., 2t−1). Also, the output of each multiplier 108 is added with the current one of the received symbols $v_0, v_1, \ldots, v_{n-1}$ by the corresponding adder 104. Further, the output of each of the adders 104 is loaded into the corresponding register 112. After n clock cycles, the 2t syndrome values are stored in the registers 112.

SUMMARY OF THE DISCLOSURE

In one embodiment, an error correcting code encoder apparatus comprises a first processor to generate a first subset of codeword symbols based on original symbols. The first processor includes an input to receive a first subset of the original symbols, and a plurality of processing stages coupled in series, wherein each processing stage iteratively calculates a corresponding one codeword symbol in the first subset of codeword symbols. Each processing stage of the first processor includes a first stage input coupled to the input of the first processor. The apparatus also comprises a second processor to generate a second subset of codeword symbols based on the original symbols. The second processor includes an input to receive a second subset of the original symbols, and a plurality of processing stages coupled in series, wherein each processing stage iteratively calculates a corresponding one codeword symbol in the second subset of codeword symbols. Each processing stage of the second processor includes a first stage input coupled to the input of the second processor.

In another embodiment, an error correcting code encoder apparatus comprises a first processor to generate a first subset of codeword symbols based on original symbols, the first processor including a first serial input to receive a first subset of the original symbols. The apparatus also comprises a second processor to generate a second subset of codeword symbols based on the original symbols, the second processor including a second serial input to receive a second subset of the original symbols.

In yet another embodiment, an error correcting code encoding method includes receiving k original symbols corresponding to a codeword, wherein k is a positive integer, and generating redundant symbols for the codeword based on the k original symbols in approximately k/2 iterations.

In still another embodiment, a computer readable medium has stored thereon machine executable instructions capable of causing a machine to generate redundant symbols for a codeword based on k original symbols in approximately k/2 iterations, wherein the k original symbols correspond to the codeword, and wherein k is a positive integer.

In yet another embodiment, an error correcting code encoder apparatus comprises a means for generating a first subset of codeword symbols based on original symbols, the means for generating the first subset of codeword symbols including a first serial input to receive a first subset of the original symbols. The apparatus also comprises a means for generating a second subset of codeword symbols based on the original symbols, the means for generating the second subset of codeword symbols including a second serial input to receive a second subset of the original symbols.

In another aspect, an error correcting code decoder apparatus comprises a syndrome calculator having an input to receive symbols of a codeword and a syndrome output. The syndrome calculator includes a plurality of processing stages, each of the processing stages corresponding to a syndrome value. Each processing stage includes a first input to receive a first symbol of the codeword during each iteration and a second input to receive a second symbol of the codeword during each iteration. The apparatus additionally comprises an error locator polynomial generator having a syndrome input coupled to the syndrome output of the syndrome calculator and an error location output. The apparatus further comprises a symbol corrector having an error location input coupled to the error location output of the error locator polynomial generator.

In another embodiment, an error correcting code decoding method includes receiving n symbols corresponding to a codeword, wherein n is a positive integer, and generating syndrome values for the codeword based on the n symbols in approximately n/2 iterations. The method also includes generating an error locator polynomial for the codeword if a syndrome for the codeword indicates one or more errors in the codeword, and correcting one or more symbols in the codeword if the syndrome for the codeword indicates one or more errors in the codeword.

In yet another embodiment, an error correcting code decoder apparatus comprises means for calculating a syndrome having an input to receive symbols of a codeword and a syndrome output. The means for calculating the syndrome includes a plurality of means for calculating respective syndrome syndrome values, wherein each means for calculating a respective syndrome value includes a first input to receive a first symbol of the codeword during each iteration and a second input to receive a second symbol of the codeword during each iteration. The apparatus also comprises means for generating an error locator polynomial having a syndrome input coupled to the syndrome output of the means for calculating the syndrome and an error location output. Additionally, the apparatus comprises means for correcting symbols in the codeword having an error location input coupled to the error location output of the means for generating an error locator polynomial.

In still another embodiment, a computer readable medium has stored thereon machine executable instructions capable of causing the machine to generate syndrome values for a codeword based on n symbols corresponding to the codeword in approximately n/2 iterations, wherein n is a positive integer. The machine executable instructions are also capable of causing the machine to generate an error locator polynomial for the codeword if a syndrome for the codeword indicates one or more errors in the codeword, and correct one or more symbols in the codeword if the syndrome for the codeword indicates one or more errors in the codeword.

DETAILED DESCRIPTION

Figure 1:
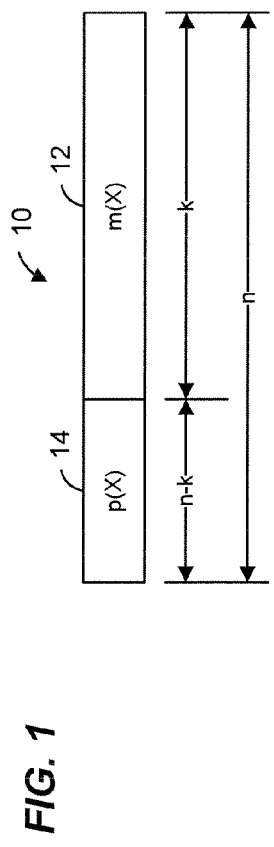
FIG. 1 is an illustration of a length-n Reed-Solomon codeword with k information symbols.
Figure 2:
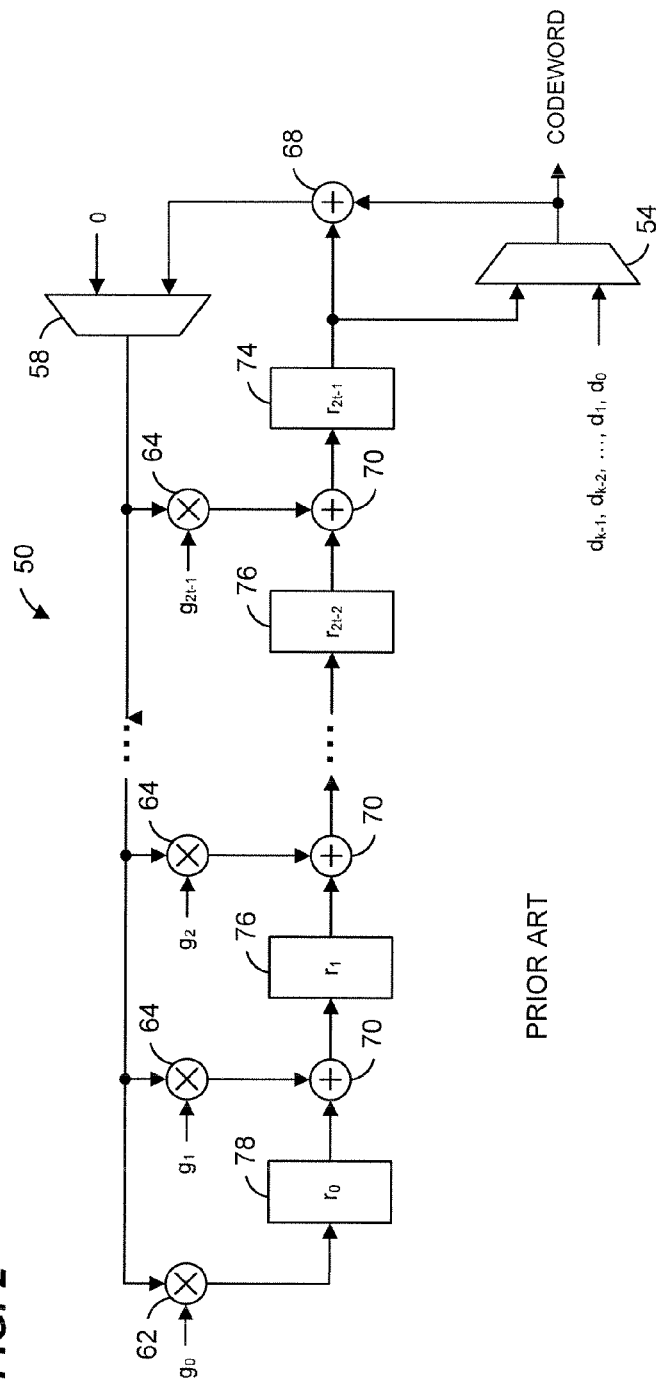
FIG. 2 is a block diagram of a prior art Reed-Solomon encoder.

In the prior art RS encoder of FIG. 2, it takes k clock cycles to compute the 2t redundant symbols because only one original symbol is processed per clock cycle. Example RS encoder methods and apparatus to be described below compute the 2t redundant symbols in significantly less clock cycles. For instance, an example RS encoder described below can compute 2t redundant symbols in approximately k/2 iterations. Generally speaking, the RS encoder methods and apparatus process two original symbols substantially simultaneously, i.e., during one iteration.

As background for explaining the example RS encoder apparatus, it is noted that Equation 5 can be rewritten as:

$$r_i^{j+2} = r_{i-2}^j + (d_j + r_{2t-1}^j)(g_{i-1} + g_{2t-1}g_i) + (d_{j+1} + r_{2t-2}^j)g_i \quad \text{Equ. 6}$$

where values of r with negative subscripts and/or negative superscripts are zero, and values of d and g with negative subscripts are zero. In Equation 6, the value of the i-th redundant symbol at the (j+2)-th iteration ($r_i^{j+2}$) is based on the (i−2)-th redundant symbol at the j-th iteration ($r_{i-2}^j$), the (2t−1)-th redundant symbol at the j-th iteration ($r_{2t-1}^j$), the (2t−2)-th redundant symbol at the j-th iteration ($r_{2t-2}^j$), the original symbol input at the j-th iteration ($d_j$), and the original symbol input at the (j+1)-th iteration ($d_{j+1}$). If it is assumed that two original symbols corresponding to $d_j$ and $d_{j+1}$ can be operated on in a single iteration, then Equation 6 can be rewritten as:

$$r_i^{j+1} = r_{i-2}^j + (d'_j + r_{2t-1}^j)(g_{i-1} + g_{2t-1}g_i) + (d''_j + r_{2t-2}^j)g_i \quad \text{Equ. 7}$$

where $d'_j$ and $d''_j$ correspond to a pair of adjacent original symbols.

Figure 4:
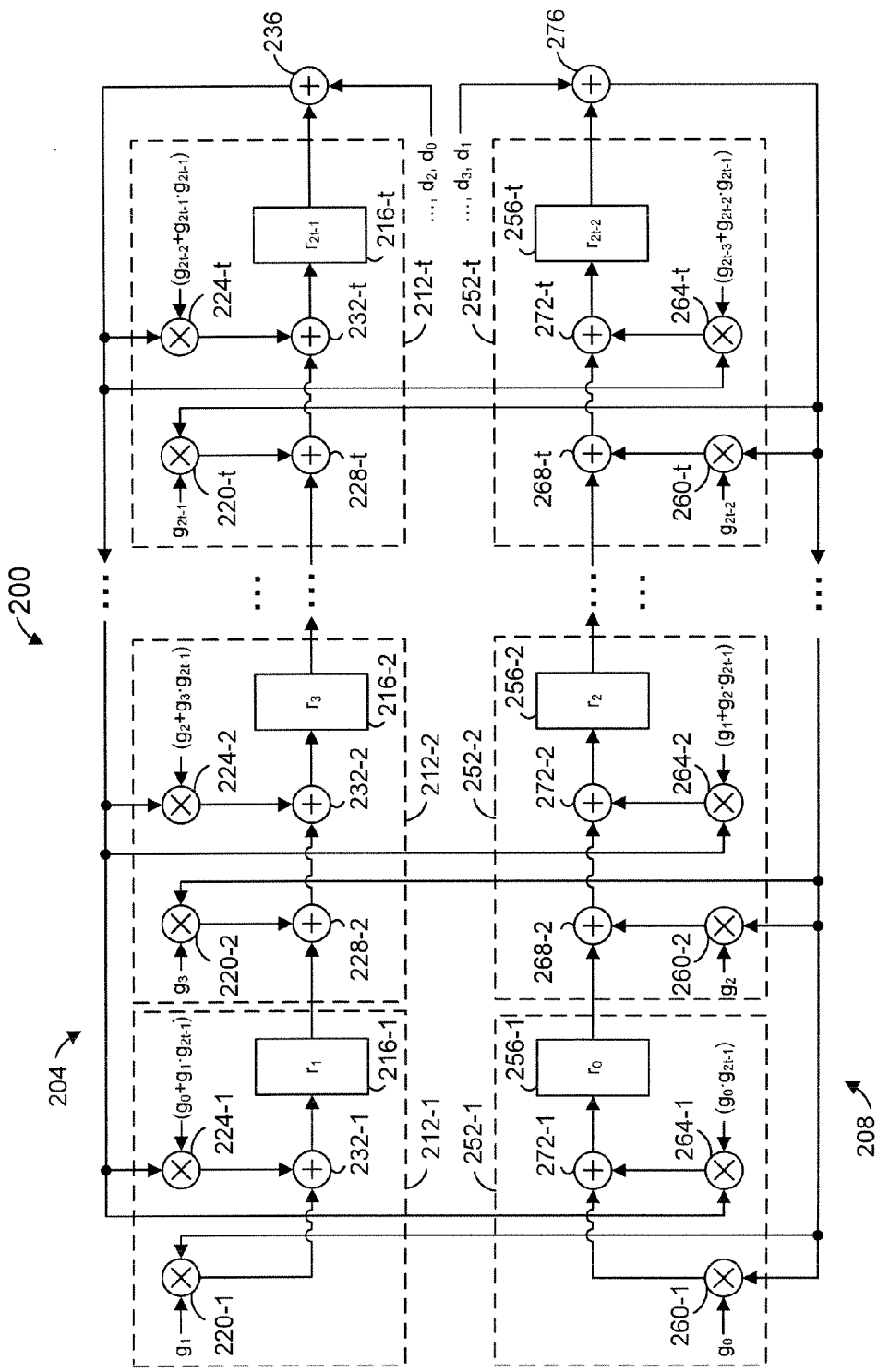
FIG. 4 is a block diagram of an example Reed-Solomon encoder.

FIG. 4 is an example RS encoder 200 that iteratively generates redundant symbols using a technique that corresponds to Equations 6 and 7. The RS encoder 200 includes a first processor 204 and a second processor 208. The first processor 204 includes t stages 212-1, 212-2, ..., 212-t. Each stage 212 includes a corresponding storage element 216, a corresponding first finite field multiplier 220, a corresponding second finite field multiplier 224, a corresponding first finite field adder 228 (except the stage 212-1), and a corresponding second finite field adder 232. The first processor 204 also includes a finite field adder 236 having a first input coupled to an output of the stage 212-t and a second input coupled to receive a subset of the k original symbols $d_0, d_1, \ldots, d_{k-2}, d_{k-1}$. In particular, if k is even, the adder 236 receives the symbols $d_0, d_2, \ldots, d_{k-4}, d_{k-2}$, in sequential order, one symbol per iteration cycle (e.g., one symbol per clock cycle), starting with $d_0$. Similarly, if k is odd, the adder 236 receives the symbols $0, d_1, d_3, \ldots, d_{k-4}, d_{k-2}$, in sequential order, one symbol per iteration cycle (e.g., one symbol per clock cycle), starting with 0.

The second processor 208 includes t stages 252-1, 252-2, ..., 252-t. Each stage 252 includes a corresponding storage element 256, a corresponding first finite field multiplier 260, a corresponding second finite field multiplier 264, a corresponding first finite field adder 268 (except the stage 252-1), and a corresponding second finite field adder 272. The second processor 208 also includes a finite field adder 276 having a first input coupled to an output of the stage 252-t and a second input coupled to receive a subset of the k original symbols $d_0, d_1, \ldots, d_{k-2}, d_{k-1}$. In particular, if k is even, the adder 276 receives the symbols $d_1, d_3, \ldots, d_{k-3}, d_{k-1}$, in sequential order, one symbol per iteration cycle (e.g., one symbol per clock cycle), starting with $d_1$. Similarly, if k is odd, the adder 236 receives the symbols $d_0, d_2, \ldots, d_{k-3}, d_{k-1}$, in sequential order, one symbol per iteration cycle (e.g., one symbol per clock cycle), starting with $d_0$.

Except for the stage 212-1, each of the stages 212 receives an output of the adder 236, an output of the adder 276, and an output of the storage element of the previous stage (i.e., $r_{i-2}$). The stage 212-1 does not receive an output of a storage element of a previous stage because it is the first stage 212. Each of the stages 212 calculates values according to Equation 7, where $i=1, 3, 5, \ldots, 2t-1$, $r_i^{j+1}$ corresponds to the value calculated by the stage and loaded into the storage element $r_i$ of the stage during an iteration, $r_{i-2}^j$ corresponds to the output of the storage element of the previous stage during the iteration (for the stage 212-1, $r_{i-2}^j$ is zero), $(d'_j + r_{2t-1}^j)$ corresponds to the output of the adder 236, and $(d''_j + r_{2t-2}^j)$ corresponds to the output of the adder 276. The multiplier 220 has a first input that is coupled to the output of the adder 276, and a second input that is coupled to the constant $g_i$. Thus, the multiplier 220 multiplies the output of the adder 276 by $g_i$, where $i=1, 3, 5, \ldots, 2t-1$. The multiplier 224 has a first input that is coupled to the output of the adder 236, and a second input that is coupled to the constant $(g_{i-1} + g_{2t-1}g_i)$. Thus, the multiplier 224 multiplies the output of the adder 236 by $(g_{i-1} + g_{2t-1}g_i)$, where $i=1, 3, 5, \ldots, 2t-1$. Except for the stage 212-1, the adder 228 has a first input coupled to an output of the storage element of the previous stage and a second input coupled to an output of the multiplier 220. Thus, the adder 228 calculates $r_{i-2}^j + (d''_j + r_{2t-2}^j)g_i$, where $i=3, 5, \ldots, 2t-1$. Except for the stage 212-1, the adder 232 has a first input coupled to an output of the multiplier 224 and a second input coupled to an output of the adder 228. Thus, the adder 232 calculates $r_{-2}^j + (d''_j + r_{2t-2}^j)g_i + (d'_j + r_{2t-1}^j)(g_{i-1} + g_{2t-1}g_i)$, where $i=1, 3, 5, \ldots, 2t-1$. With the stage 212-1, which omits the adder 228, the output of the multiplier 220-1 is coupled to the second input of the adder 232-1, and the adder 232-1 calculates $(d''_j + r_{2t-2}^j)g_i + (d'_j + r_{2t-1}^j)(g_{i-1} + g_{2t-1}g_i)$, where $i=1$.

For all of the stages 212, an output of the adder 232 is coupled to an input of the storage element 216 of the stage. Each storage element 216 may comprise a register, a memory location, etc. If each storage element 216 comprises a register, each of the registers 216 may include a clock input coupled to a clock signal (not shown). Each iteration may correspond to a clock cycle. At an appropriate time during a clock cycle (e.g., a rising edge, a falling edge, etc.), when the output of the adder 232 is ready, the output of the adder 232 is loaded into the register 216.

Except for the stage 252-1, each of the stages 252 receives an output of the adder 236, an output of the adder 276, and an output of the storage element of the previous stage 252 (i.e., $r_{i-2}$). The stage 252-1 does not receive an output of a storage element of a previous stage because it is the first stage 252. Each of the stages 252 calculates values according to Equation 7, where $i=0, 2, 4, \ldots, 2t-2$, $r_i^{2+1}$ corresponds to the value calculated by the stage and loaded into the storage element $r_i$ of the stage during an iteration, $r_{i-2}^j$ corresponds to the output of the storage element of the previous stage during the iteration (for the stage 252-1, is zero), $(d'_j + r_{2t-1}^j)$ corresponds to the output of the adder 236, and $(d'_j + r_{2t-1}^j)$ corresponds to the output of the adder 276. The multiplier 260 has a first input that is coupled to the output of the adder 276, and a second input that is coupled to the constant $g_i$. Thus, the multiplier 260 multiplies the output of the adder 276 by $g_i$, where $i=0, 2, 4, \ldots, 2t-2$. The multiplier 264 has a first input that is coupled to the output of the adder 236, and a second input that is coupled to the constant $(g_{i-1} + g_{2t-1}g_i)$. Thus, the multiplier 264 multiplies the output of the adder 236 by $(g_{i-1} + g_{2t-1}g_i)$, where $i=0, 2, 4, \ldots, 2t-2$. Except for the stage 252-1, the adder 268 has a first input coupled to an output of the storage element of the previous stage and a second input coupled to an output of the multiplier 260. Thus, the adder 268 calculates $r_{i-2}^j + (d''_j + r_{2t-2}^j)g_i$, where $i=2, 4, \ldots, 2t-2$. Except for the stage 252-1, the adder 272 has a first input coupled to an output of the multiplier 264 and a second input coupled to an output of the adder 268. Thus, the adder 272 calculates $r_{i-2}^j + (d''_j + r_{2t-2}^j)g_i + (d'_j + r_{2t-1}^j)(g_{i-1} + g_{2t-1}g_i)$, where $i=0, 2, 4, \ldots, 2t-2$. With the stage 252-1, which omits the adder 268, the output of the multiplier 260-1 is coupled to the second input of the adder 272-1, and the adder calculates $(d''_j + r_{2t-2}^j)g_i + (d'_j + r_{2t-1}^j)(g_{i-1} + g_{2t-1}g_i)$, where $i=0$.

For all of the stages 252, an output of the adder 272 is coupled to an input of the storage element 256 of the stage. Each storage element 256 may comprise a register, a memory location, etc. If each storage element 256 comprises a register, each of the registers 256 includes a clock input coupled to the clock signal (not shown). Each iteration may correspond to a clock cycle. At an appropriate time during a clock cycle (e.g., a rising edge, a falling edge, etc.), when the output of the adder 272 is ready, the output of the adder 272 is loaded into the register 256.

Although the stage 220-1 and the stage 252-1 are shown omitting a corresponding adder 228-1 and a corresponding adder 268-1, respectively, each optionally may include a corresponding adder 228-1 and a corresponding adder 268-1. For example, the adder 228-1 may have a first input coupled to zero, a second input coupled to an output of the multiplier 220-1, and an output coupled to the second input of the adder 232-1. Thus, the adder 228-1 merely provides the output of the multiplier 220-1 to the adder 232-1. Similarly, the adder 268-1 may have a first input coupled to zero, a second input coupled to an output of the multiplier 260-1, and an output coupled to the second input of the adder 272-1. Thus, the adder 268-1 merely provides the output of the multiplier 260-1 to the adder 272-1.

In operation, the encoder 200 iteratively generates the values of the 2t redundant symbols, and the updated values of the redundant symbols are stored in the storage elements 216, 256. In particular, the first processor 204 iteratively generates the values of a first subset of the redundant symbols, t symbols $p_1, p_3, \ldots p_{2t-3}, p_{2t-1}$, and the updated values of the first subset of redundant symbols are stored in the storage elements 216 (i.e., $p_i$ is stored in 216-1 ($r_1$), $p_3$ is stored in 216-2 ($r_3$), etc.). The first processor 208 iteratively generates the values of a second subset of the redundant symbols, t symbols $p_0$, $p_2, \ldots p_{2t-4}, p_{2t-2}$, and the updated values of the second subset of redundant symbols are stored in the storage elements 256 (i.e., $p_0$ is stored in 256-1 ($r_0$), $p_2$ is stored in 256-2 ($r_2$), etc.).

Initially, the contents of the storage elements 216, 256 are cleared to zero. If there are an even number of original symbols, during a first iteration (e.g., a first clock cycle), the symbol $d_0$ is provided to the adder 236, and the output of the adder 236 is operated on by the multipliers 224, 260. Also during the first iteration, the symbol $d_1$ is provided to the adder 276, and the output of the adder 276 is operated on by the multipliers 220, 264. If there are an odd number of original symbols, during the first iteration, the symbol 0 is provided to the adder 236 the symbol $d_0$ is provided to the adder 276. The adders 228, 232, 260, 264 operate on the outputs of the multipliers 220, 224, 260, 264. When the outputs of the adders 232 are ready, they are loaded into the storage elements 216. Similarly, when the outputs of the adders 272 are ready, they are loaded into the storage elements 256. If k is even, during the subsequent k/2−1 iterations (e.g., clock cycles), the symbols $d_2, d_4, \ldots, d_{k-4}, d_{k-2}$ are provided to the adder 236 and subsequent results loaded into the storage elements 216, and the symbols $d_3, d_5, \ldots, d_{k-3}, d_{k-1}$ are provided to the adder 276 and subsequent results loaded into the storage elements 256. At the end of k/2 iterations, the redundant symbols are ready and are stored in the storage elements 216, 256 (i.e., $p_0$ is stored in 256-1 ($r_0$), $p_1$ is stored in 212-1 ($r_1$), $p_2$ is stored in 256-2 ($r_2$), $p_3$ is stored in 212-3 ($r_3$), etc.).

If k is even, during the subsequent k/2−1 iterations, the symbols $d_1, d_3, \ldots, d_{k-4}, d_{k-2}$ are provided to the adder 236 and subsequent results loaded into the storage elements 216, and the symbols $d_2, d_4, \ldots, d_{k-3}, d_{k-1}$ are provided to the adder 276 and subsequent results loaded into the storage elements 256. At the end of (k+1)/2 iterations, the redundant symbols are ready and are stored in the storage elements 216, 256 (i.e., $p_0$ is stored in 256-1 ($r_0$), $p_1$ is stored in 212-1 ($r_1$), $p_2$ is stored in 256-2 ($r_2$), $p_3$ is stored in 212-3 ($r_3$), etc.).

Thus, the 2t redundant symbols are calculated in approximately k/2 iterations. Then, they may be retrieved from the storage elements 216, 256 in a variety of ways. For instance, they could be clocked from the storage elements in a manner similar to that of the encoder 50 of FIG. 2. For example, multiplexers could be added to the encoder 200 similar to the multiplexers of the encoder 50. As another example, the outputs of the storage elements 216, 256 could be coupled to one or more busses to allow the redundant symbols to be retrieved from the storage elements 216, 256.

Figure 5:
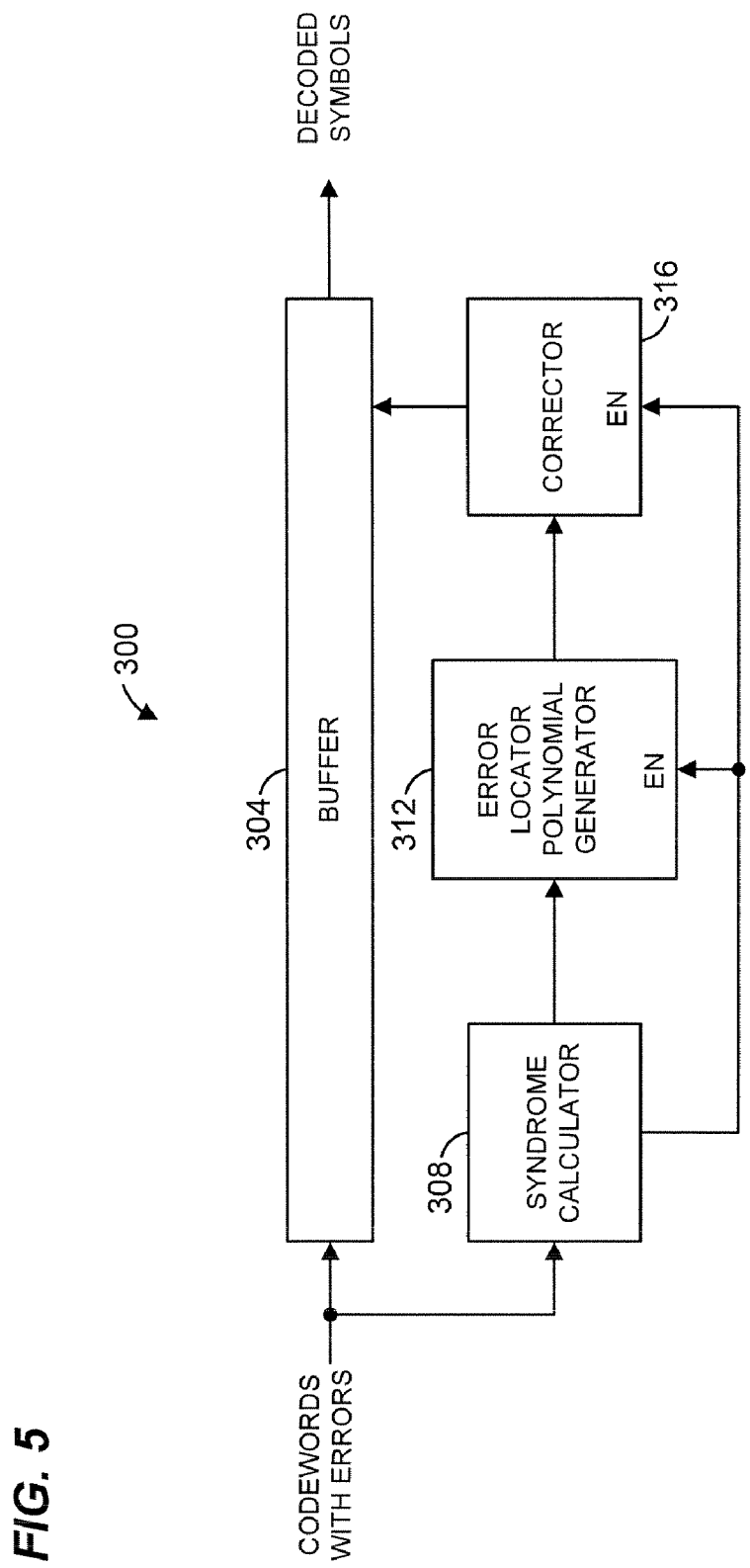
FIG. 5 is a block diagram of an example Reed-Solomon decoder.

FIG. 5 is a block diagram of an example RS decoder 300 that may be included within a receiver. The decoder 300 includes a buffer 304 to store received codewords that may include errors. A syndrome calculator 308 also receives the codewords, and generates a syndrome for each codeword. If a syndrome (including 2t=n−k syndrome values) is zero, then the corresponding received codeword is a valid codeword, and there are no errors. If one or more of the syndrome values are non-zero, on the other hand, this indicates that the corresponding received codeword is not a valid codeword and that there are one or more errors. Thus, the syndrome calculator 308 may also generate an enable signal based on the syndrome. The enable signal may indicate whether the syndrome is zero for a codeword. For instance, the enable signal may, in effect, disable further error correction processing for a codeword if the syndrome is zero. This may help reduce power consumption of the decoder 300, for example.

The RS decoder 300 also includes an error locator polynomial generator 312 coupled to the syndrome calculator 308. The error locator polynomial generator 312 computes an error locator polynomial for a codeword based on syndrome values received from the syndrome calculator 308. The error locator polynomial can be calculated using a variety of techniques including a Berlekamp-Massey algorithm (BMA), an inversionless BMA (iBMA) such as described in T. K. Truong et al., "Inversionless Decoding of Both Errors and Erasures of Reed-Solomon Code", I.E.E.E. Transactions on Communications, Vol. 46, No. 8, August 1998), a Euclidean algorithm, Chien's search technique described in R. T. Chien, "Cyclic Decoding Procedure for the Bose-Chandhuri-Hocquenghem Codes", I.E.E.E. Transactions on Information Theory, Vol. IT-10, pp. 357 363, October 1964, etc. If a BMA algorithm is utilized, the error locator polynomial generator 312 may also generate a scratch polynomial.

The error locator polynomial generator 312 may include an enable input coupled to the enable signal generated by the syndrome calculator 308. If the enable input is included, the error locator polynomial generator 312 may compute an error locator polynomial for a codeword when the enable signal indicates that the syndrome for the codeword is not zero. For example, computation of the error locator polynomial (and the scratch polynomial) may be disabled if the enable signal indicates that the syndrome for the codeword is zero.

The RS decoder 300 also includes a corrector 316 coupled to the error locator polynomial generator 312, the syndrome calculator 308, and the buffer 304. The corrector 316 calculates error values for symbols in error in a codeword and corrects the errors in the buffer 304. For instance, the corrector 316 may generate an error evaluator polynomial based on the syndrome values and the error locator polynomial using any of a variety of techniques such as Formey's algorithm disclosed in G. D. Formey, "On Decoding BCH Codes", I.E.E.E Transactions on Information Theory, Vol. IT-11, pp. 549 557, October 1965. If the error locator polynomial generator 312 utilizes a BMA algorithm, the corrector 316 may search zeros of the error locator polynomial to find error locations, and may calculate error values using the error locator polynomial and the scratch polynomial.

The corrector 316 may include an enable input coupled to the enable signal generated by the syndrome calculator 308. If the enable input is included, the corrector 316 may compute error values for a codeword when the enable signal indicates that the syndrome for the codeword is not zero. For example, computation of the error values and correction of the errors in the buffer 304 may be disabled if the enable signal indicates that the syndrome for the codeword is zero.

Syndrome values for a codeword may be calculated according to:

$$S_g = \sum_{i=0}^{n-1} v_i \alpha^{ig}$$ Equ. 8 where $S_g$ is the g-th syndrome value, g=b+1, b+2, b+2t, b is a parameter of the RS code and is usually 0, $v_i$ is the i-th symbol of the codeword, $v_0, v_1, \ldots, v_{n-1}$ are the symbols of the received codeword, and $\alpha^{ig}$ is the i-th root of the generator polynomial.

The syndromes according to Equation 8 can be calculated iteratively according to:

$$S_g^{j+1} = \alpha^g S_g^j + v_{n-1-j} \quad \text{Equ. 9}$$

for $j=0, 1, \ldots, n-1$, where $S_g^j$ is the g-th syndrome value at the j-th iteration, and $S_g^0$ is zero. Equation 9 can be rewritten as:

$$S_g^{j+1} = \alpha^{2g} S_g^j + \alpha^g v_{n-1-2j} + v_{n-2-2j} \quad \text{Equ. 10}$$

for $j=0, 1, \ldots, n/2-1$ if n is even or for $j=0, 1, \ldots, (n+1)/2-1$ if n is odd, and $S_g^0$ is zero.

Figure 3:
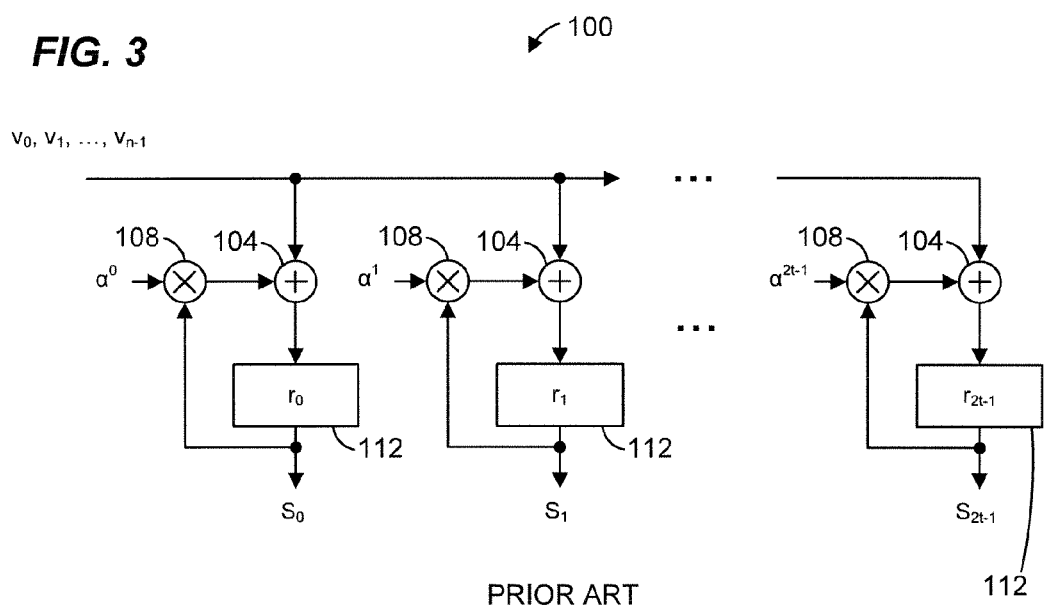
FIG. 3 is a block diagram of a prior art syndrome calculator for a Reed-Solomon decoder.

In the prior art RS syndrome calculator of FIG. 3, it takes n clock cycles to compute the 2t syndrome values because only one codeword symbol is processed per clock cycle. Example syndrome calculation methods and apparatus to be described below compute the 2t syndrome values in significantly less clock cycles. For instance, an example syndrome calculator described below can compute 2t syndrome values in approximately n/2 iterations. Generally speaking, the syndrome calculation methods and apparatus process two codeword symbols substantially simultaneously, i.e., during one iteration.

Figure 6:
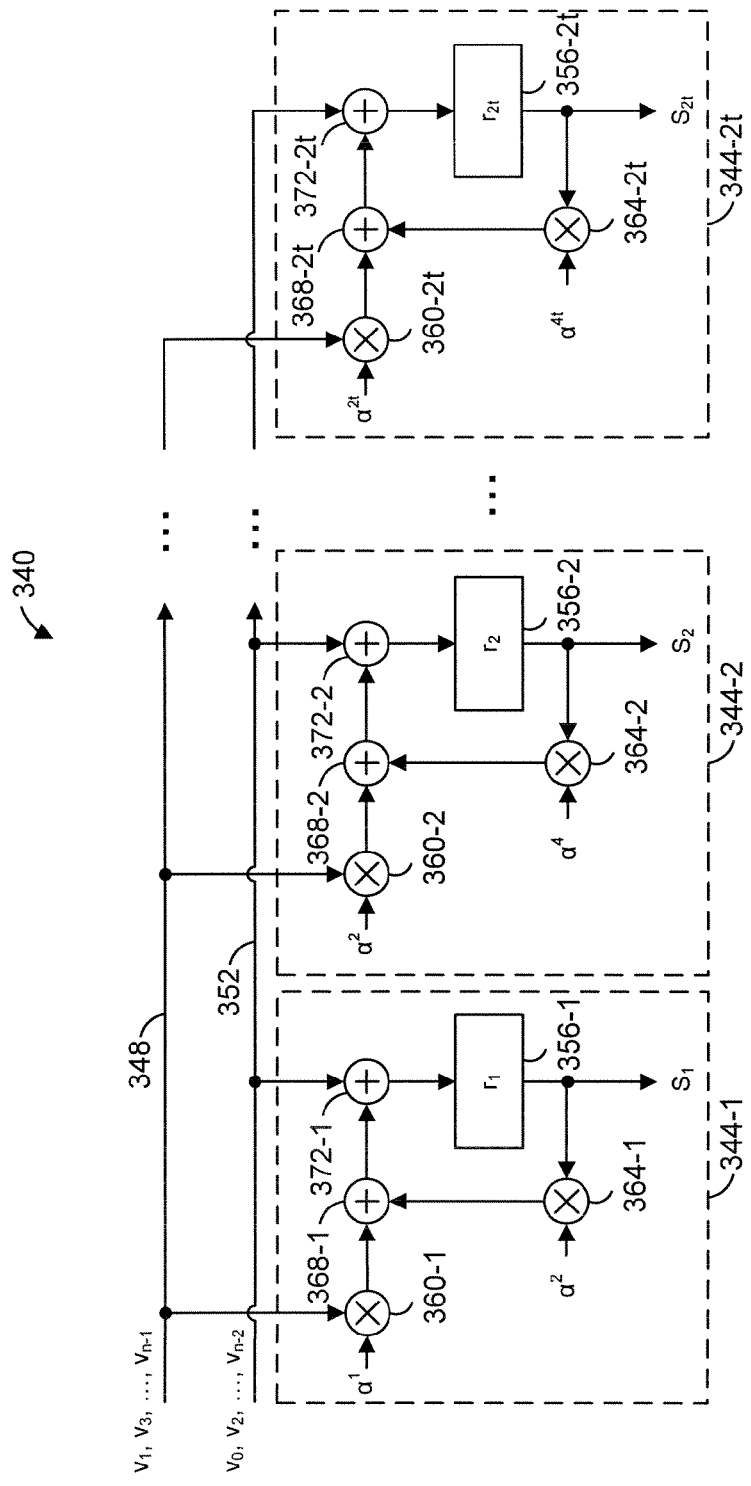
FIG. 6 is a block diagram of an example syndrome calculator for a Reed-Solomon decoder such as the Reed-Solomon decoder of FIG. 5.

FIG. 6 is a block diagram of an example syndrome calculator 340. The syndrome calculator 340 may be used with the example RS decoder 300 of FIG. 5. Of course, the syndrome calculator 340 also may be utilized in decoders other than the decoder 300 of FIG. 5 as well. The syndrome calculator 340 calculates syndrome values according to Equation 10.

The syndrome calculator 340 includes 2t processing stages 344, each stage to calculate one of the 2t syndrome values for a codeword. Each stage 344 operates on two adjacent symbols of the codeword during an iteration (e.g., a clock cycle), and each stage 344 may be coupled to two lines 348 and 352 to receive the codeword symbols. For example, if n is even, the line 348 may provide the codeword symbols, $v_{n-1}, v_{n-3}, \ldots, v_3, v_1$ in sequential order, one symbol per iteration (e.g., per clock cycle), starting with $v_{n-1}$, and the line 352 may provide the codeword symbols, $v_{n-2}, v_{n-4}, \ldots, v_2, v_0$ in sequential order, one symbol per iteration (e.g., per clock cycle), starting with $v_{n-2}$. If n is odd, the line 348 may provide the zero-padded the codeword symbols, $0, v_{n-2}, \ldots, v_3, v_1$ in sequential order, one symbol per iteration (e.g., per clock cycle), starting with 0, and the line 352 may the codeword symbols, $v_{n-1}, v_{n-3}, \ldots, v_2, v_0$ in sequential order, one symbol per iteration (e.g., per clock cycle), starting with $v_{n-1}$.

Each stage 344 includes a corresponding storage element 356, a corresponding first finite field multiplier 360, a corresponding second finite field multiplier 364, a corresponding first finite field adder 368, and a corresponding second finite field adder 372.

Each of the stages 344 calculates values according to Equation 10, where b is zero, $g=1, 2, \ldots, 2t$, $S_g^{j+1}$ corresponds to the value calculated by the g-th stage and loaded into the storage element $r_g$ of the stage during an iteration, $S_g^j$ corresponds to the output of the g-th storage element during the iteration, $\alpha^g v_{n-1-2j}$ corresponds to the output of the multiplier 360, $\alpha^{2g} S_g^j$ corresponds to the output of the multiplier 364, $\alpha^{2g} S_g^j + \alpha^g v_{n-1-2j}$ corresponds to the output of the adder 368, and $\alpha^{2g} S_g^j + \alpha^g v_{n-1-2j} + v_{n-2-2j}$ corresponds to the output of the adder 372. One of ordinary skill in the art will recognize that the example decoder 340 may be modified for implementations in which b is non-zero.

The multiplier 360 has a first input that is coupled to the line 348, and a second input that is coupled to a constant $\alpha^g$, where $g=1, 2, \ldots, 2t$. The constants a constant $\alpha^g$ correspond to the 2t roots of the generator polynomial. If n is even, the multiplier 360 multiplies a corresponding one of the codeword symbols $v_{n-1}, v_{n-3}, \ldots, v_3, v_1$ by $\alpha^g$ during each iteration. If n is odd, the multiplier 360 multiplies a corresponding one of the codeword symbols $0, v_{n-2}, v_{n-4}, \ldots, v_3, v_1$ by $\alpha^g$ during each iteration. The multiplier 364 has a first input that is coupled to the output of the storage element 356, and a second input that is coupled to a constant $\alpha^{2g}$, where $g=1, 2, \ldots, 2t$. Thus, the multiplier 360 multiplies the output of the storage element 356 ( ) by $\alpha^{2g}$.

The adder 368 has a first input coupled to an output of the multiplier 360 and a second input coupled to an output of the multiplier 364. Thus, the adder 368 adds $\alpha^g v_{n-1-2j}$ with $\alpha^{2g} S_g^j$. The adder 372 has a first input coupled to the line 352 and a second input coupled to an output of the adder 368. Thus, the adder 372 adds $\alpha^{2g} S_g^j + \alpha^g v_{n-1-2j}$ with $v_{n-2-2j}$.

For all of the stages 344, an output of the adder 372 is coupled to an input of the storage element 356 of the stage. Each of the storage elements 356 may comprise a register, a memory location, etc. If each of the storage elements comprises a register, each of the registers 356 includes a clock input coupled to a clock signal (not shown). Each iteration may correspond to a clock cycle. At an appropriate time during a clock cycle (e.g., a rising edge, a falling edge, etc.), when the output of the adder 372 is ready, the output of the adder 372 is loaded into the register 356.

In operation, the syndrome calculator 340 iteratively generates the 2t syndromes, and the updated values of the syndromes are stored in the storage elements 356. Calculation of the syndromes takes n/2 iterations (e.g., clock cycles) if n is even, and (n+1)/2 iterations (e.g., clock cycles) if n is odd. Thus, after n/2 iterations if n is even or (n+1)/2 iterations if n is odd, the 2t syndrome values may be retrieved from the storage elements 356. In other words, calculation of the syndromes is completed in approximately n/2 iterations.

Although the example encoder 200, the example decoder 300 and the example syndrome calculator 340 were described in the context of RS codes, one of ordinary skill in the art will recognize that the example encoder 200, the example decoder 300 and/or the example syndrome calculator 340 can be modified to work with other types of error correcting block codes such as Golay codes, BCH codes, Hamming codes, etc.

The example encoder 200, the example decoder 300 and the example syndrome calculator 340 may be implemented in hardware. For example, some or all of the example encoder 200, the example decoder 300 and/or the example syndrome calculator 340 may be implemented in, for example, a custom integrated circuit (IC), an application specific integrated circuit (ASIC), a field programmable logic array (FPGA), a programmable logic array (PLA), etc. Additionally or alternatively, some or all of the example encoder 200, the example decoder 300 and/or the example syndrome calculator 340 may be implemented in software stored in, for example, a memory and implemented on a processor or implemented in firmware as desired. If implemented in software, the routines may be stored in any computer readable memory such as in RAM, ROM, flash memory, a magnetic disk, a laser disk, or other storage medium. Likewise, this software may be delivered to a device (such as a transmitter, receiver, hard disk controller, etc.) via any known or desired delivery method including, for example, over a communication channel such as a telephone line, the Internet, a wireless connection, etc., or via a transportable medium, such as a computer-readable disk, flash drive, etc. Delivery methods may include, for example, delivery on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium).

More generally, the various blocks, operations, and techniques described above may be implemented in hardware, firmware, software, or any combination of hardware, firmware, and/or software.

The above-described techniques, apparatus, etc., may be embodied in any type of device that utilizes forward error correction including, for example, communication devices such as for use in wired or wireless communication systems, storage devices, etc. Referring now to FIGS. 7A-7H, various example devices that may above-described techniques, apparatus, etc. are shown.

Figure 7A:
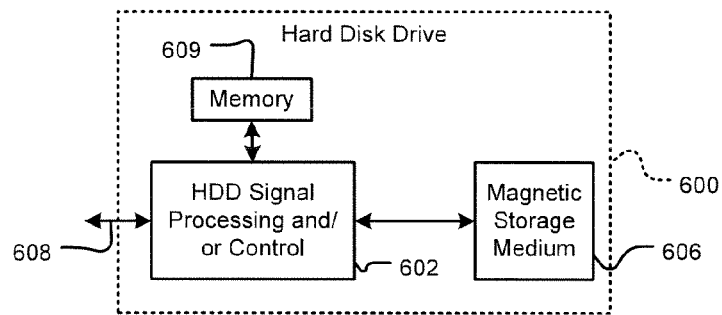
FIG. 7A is a block diagram of a hard disk drive system that may utilize an error correcting code encoder and/or decoder.

For example, referring to FIG. 7A, a hard disk drive 600 may utilize encoding and/or decoding techniques such as described above and which may be implemented by signal processing and/or control circuits, which are generally identified in FIG. 7A at 602. In some implementations, signal processing and/or control circuit 602 and/or other circuits (not shown) in HDD 600 may process data, perform coding and/or encryption, perform calculations, and/or format data that is output to and/or received from a magnetic storage medium 606.

HDD 600 may communicate with a host device (not shown) such as a computer, mobile computing devices such as personal digital assistants, cellular phones, media or MP3 players and the like, and/or other devices via one or more wired or wireless communication links 608. HDD 600 may be connected to memory 609, such as random access memory (RAM), a low latency nonvolatile memory such as flash memory, read only memory (ROM) and/or other suitable electronic data storage.

Figure 7B:
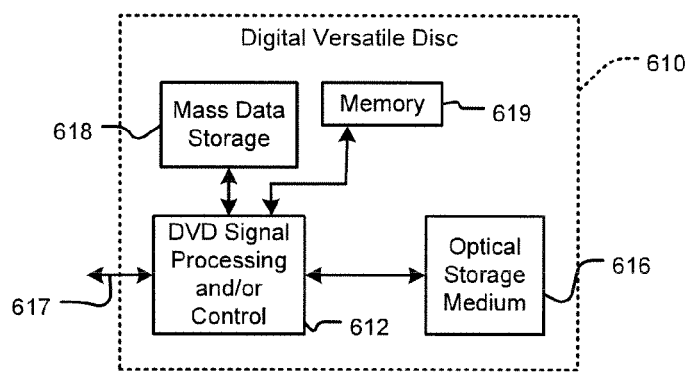
FIG. 7B is a block diagram of a digital versatile drive system that may utilize an error correcting code encoder and/or decoder.

Referring now to FIG. 7B, a digital versatile disc (DVD) drive 610 may utilize encoding and/or decoding techniques such as described above. The encoding and/or decoding techniques may be implemented by either or both signal processing and/or control circuits, which are generally identified in FIG. 7B at 612, and/or mass data storage 618 of DVD drive 610. Signal processing and/or control circuit 612 and/or other circuits (not shown) in DVD 610 may process data, perform coding and/or encryption, perform calculations, and/or format data that is read from and/or data written to an optical storage medium 616. In some implementations, signal processing and/or control circuit 612 and/or other circuits (not shown) in DVD 610 can also perform other functions such as encoding and/or decoding and/or any other signal processing functions associated with a DVD drive.

DVD drive 610 may communicate with an output device (not shown) such as a computer, television or other device via one or more wired or wireless communication links 617. DVD 610 may communicate with mass data storage 618 that stores data in a nonvolatile manner. Mass data storage 618 may include a hard disk drive (HDD) such as that shown in FIG. 7A. The HDD may be a mini HDD that includes one or more platters having a diameter that is smaller than approximately 1.8". DVD 610 may be connected to memory 619, such as RAM, ROM, low latency nonvolatile memory such as flash memory, and/or other suitable electronic data storage.

Figure 7C:
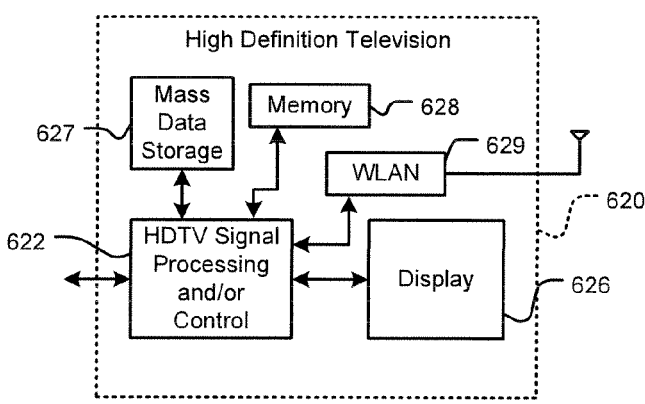
FIG. 7C is a block diagram of a high definition television that may utilize an error correcting code encoder and/or decoder.

Referring to FIG. 7C, a high definition television (HDTV) 620 may utilize encoding and/or decoding techniques such as described above. The HDTV 620 includes signal processing and/or control circuits, which are generally identified in FIG. 7C at 622, a WLAN interface 629, and a mass data storage 627. The encoding and/or decoding techniques may be utilized in the WLAN interface 629 or the signal processing circuit and/or control circuit 622, for example. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices. The mass data storage 627 may include one or more hard disk drives (HDDs) and/or one or more digital versatile disks (DVDs). At least one HDD may have the configuration shown in FIG. 7A and/or at least one DVD may have the configuration shown in FIG. 7B. One or more of the HDDs may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via a WLAN network interface 629.

Figure 7D:
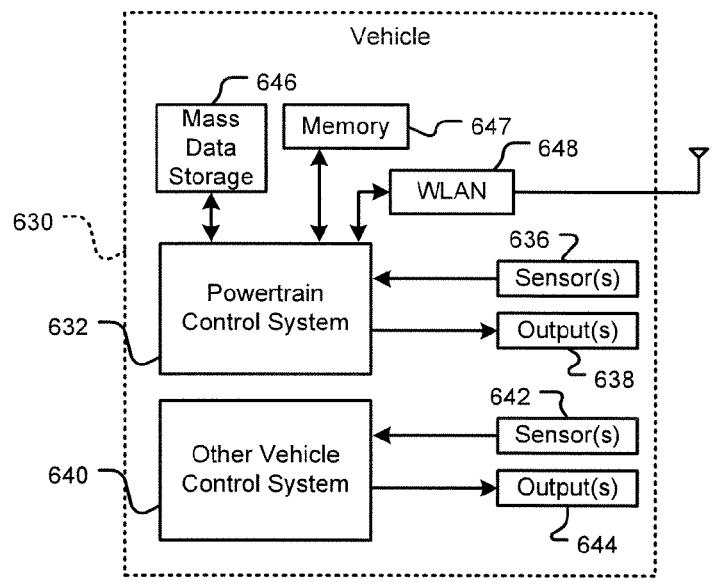
FIG. 7D is a block diagram of a vehicle that may utilize an error correcting code encoder and/or decoder.

Referring now to FIG. 7D, a control system of a vehicle 630 may utilize encoding and/or decoding techniques such as described above. In some implementations, encoding and/or decoding techniques may be implemented by a powertrain control system 632 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The encoding and/or decoding techniques may also be implemented in other control systems 640 of vehicle 630. Control system 640 may likewise receive signals from input sensors 642 and/or output control signals to one or more output devices 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices for example hard disk drives HDD and/or DVDs. At least one HDD may have the configuration shown in FIG. 7A and/or at least one DVD may have the configuration shown in FIG. 7B. One or more of the HDDs may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. The encoding and/or decoding techniques may also be implemented in the WLAN interface 648. The control system 640 may also include mass data storage, memory and/or a WLAN interface (all not shown).

Figure 7E:
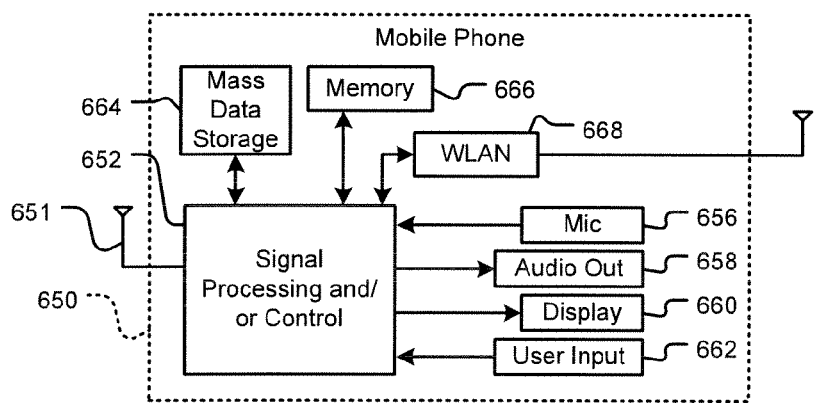
FIG. 7E is a block diagram of a mobile phone that may utilize an error correcting code encoder and/or decoder.

Referring now to FIG. 7E, a mobile phone 650 (e.g., a cellular phone) that may include an antenna 651 may utilize encoding and/or decoding techniques such as described above. The phone 650 includes signal processing and/or control circuits, which are generally identified in FIG. 7E at 652, a WLAN interface 668, and a mass data storage 664. The encoding and/or decoding techniques may be implemented in the signal processing and/or control circuits 652 and/or the WLAN interface 668, for example. In some implementations, phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Phone 650 may communicate with mass data storage 664 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. At least one HDD may be a mini HDD that includes one or more platters having a diameter that is smaller than approximately 1.8". Phone 650 may be connected to memory 666 such as RAM, ROM, low latency nonvolatile memory such as flash memory and/or other suitable electronic data storage. Phone 650 also may support connections with a WLAN via a WLAN network interface 668.

Figure 7F:
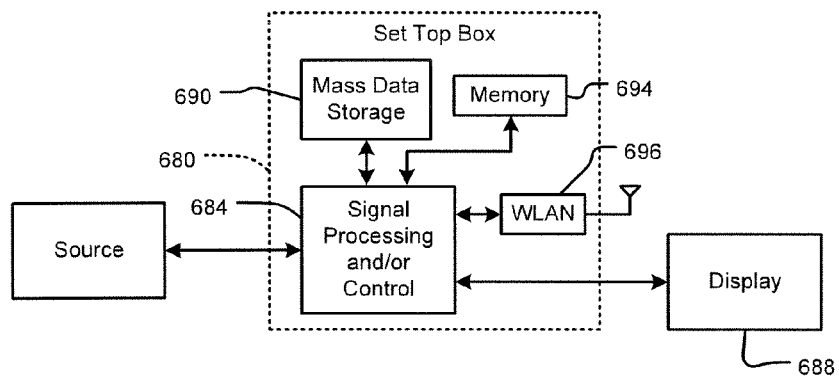
FIG. 7F is a block diagram of a set top box that may utilize an error correcting code encoder and/or decoder.

Referring now to FIG. 7F, a set top box 680 may utilize encoding and/or decoding techniques such as described above. The set top box 680 includes signal processing and/or control circuits, which are generally identified in FIG. 7F at 684, a WLAN interface 696, and a mass data storage device 690. The encoding and/or decoding techniques may be implemented in the signal processing and/or control circuits 684 and/or the WLAN interface 696, for example. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices for example hard disk drives HDD and/or DVDs. At least one HDD may have the configuration shown in FIG. 7A and/or at least one DVD may have the configuration shown in FIG. 7B. At least one HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via a WLAN network interface 696.

Figure 7G:
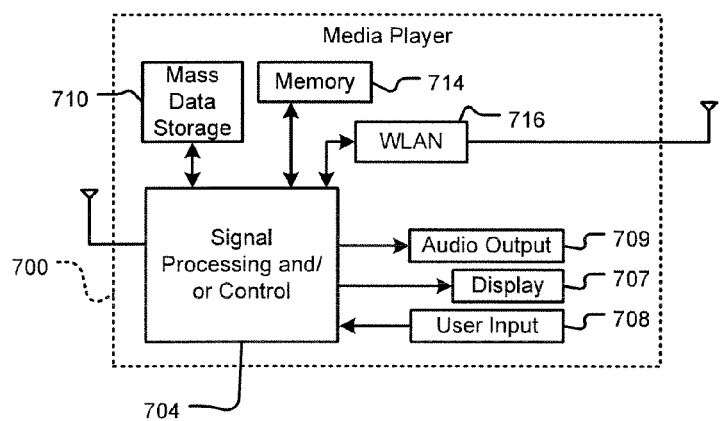
FIG. 7G is a block diagram of a media player that may utilize an error correcting code encoder and/or decoder.

Referring now to FIG. 7G, a media player 700 may utilize encoding and/or decoding techniques such as described above. The media player 700 may include signal processing and/or control circuits, which are generally identified in FIG. 7G at 704, a WLAN interface 716, and a mass data storage device 710. The encoding and/or decoding techniques may be implemented in the signal processing and/or control circuits 704 and/or the WLAN interface 716, for example. In some implementations, media player 700 includes a display 707 and/or a user input 708 such as a keypad, touchpad and the like. In some implementations, media player 700 may employ a graphical user interface (GUI) that typically employs menus, drop down menus, icons and/or a point-and-click interface via display 707 and/or user input 708. Media player 700 further includes an audio output 709 such as a speaker and/or audio output jack. Signal processing and/or control circuits 704 and/or other circuits (not shown) of media player 700 may process data, perform coding and/or encryption, perform calculations, format data and/or perform any other media player function.

Media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 7A and/or at least one DVD may have the configuration shown in FIG. 7B. At least one HDD may be a mini HDD that includes one or more platters having a diameter that is smaller than approximately 1.8". Media player 700 may be connected to memory 714 such as RAM, ROM, low latency nonvolatile memory such as flash memory and/or other suitable electronic data storage. Media player 700 also may support connections with a WLAN via a WLAN network interface 716. Still other implementations in addition to those described above are contemplated.

Figure 7H:
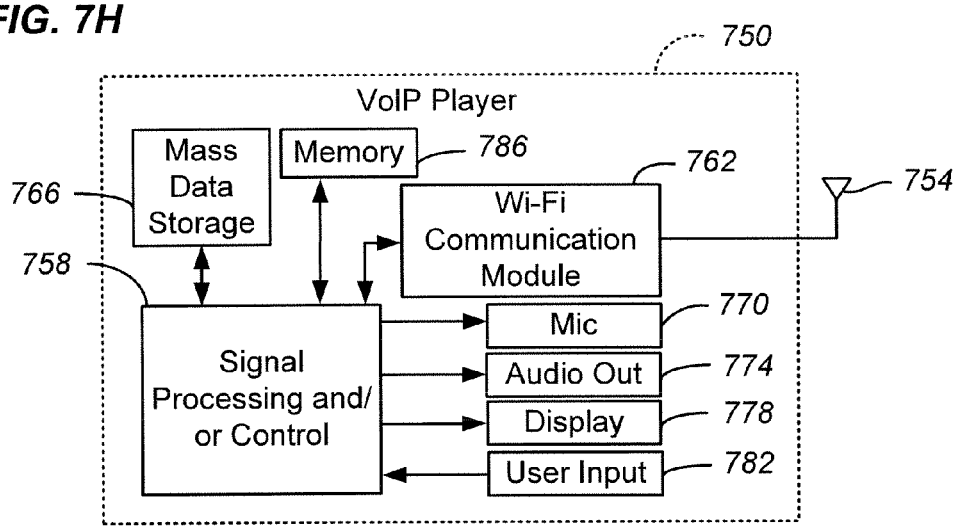
FIG. 7H is a block diagram of a voice over IP device that may utilize an error correcting code encoder and/or decoder.

Referring to FIG. 7H, a Voice over Internet Protocol (VoIP) phone 750 may utilize encoding and/or decoding techniques such as described above. The VoIP phone 750 may include an antenna 754, signal processing and/or control circuits 758, a wireless interface 762, and a mass data storage 766. The encoding and/or decoding techniques may be implemented in the signal processing and/or control circuits 758 and/or the wireless interface 762, for example. In some implementations, VoIP phone 750 includes, in part, a microphone 770, an audio output 774 such as a speaker and/or audio output jack, a display monitor 778, an input device 782 such as a keypad, pointing device, voice actuation and/or other input devices, and a Wireless Fidelity (Wi-Fi) communication module 762. Signal processing and/or control circuits 758 and/or other circuits (not shown) in VoIP phone 750 may process data, perform coding and/or encryption, perform calculations, format data and/or perform other VoIP phone functions.

VoIP phone 750 may communicate with mass data storage 766 that stores data in a nonvolatile manner such as optical and/or magnetic storage devices, for example hard disk drives HDD and/or DVDs. At least one HDD may have the configuration shown in FIG. 7A and/or at least one DVD may have the configuration shown in FIG. 7B. At least one HDD may have the configuration shown in FIG. 7A and/or at least one DVD may have the configuration shown in FIG. 7B. The HDD may be a mini HDD that includes one or more platters having a diameter that is smaller than approximately 1.8". VoIP phone 750 may be connected to memory 786, which may be a RAM, ROM, low latency nonvolatile memory such as flash memory and/or other suitable electronic data storage. VoIP phone 750 is configured to establish communications link with a VoIP network (not shown) via Wi-Fi communication module 762.

Moreover, while the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

What is claimed is:

1. An error correcting code encoder for generating a codeword according to an error correcting code, the encoder comprising:
   a first processor to generate a first subset of codeword symbols of the codeword based on original symbols, wherein the codeword is an encoding of the original symbols, wherein the first processor includes:
      an input to receive a first subset of the original symbols; and
      a plurality of processing stages coupled in series, wherein each processing stage iteratively calculates a corresponding one codeword symbol in the first subset of codeword symbols, wherein each processing stage of the first processor includes a first stage input coupled to the input of the first processor; and
   the apparatus further comprising a second processor to generate a second subset of codeword symbols of the codeword based on the original symbols, the second processor including:
      an input to receive a second subset of the original symbols; and
      a plurality of processing stages coupled in series, wherein each processing stage iteratively calculates a corresponding one codeword symbol in the second subset of codeword symbols, wherein each processing stage of the second processor includes (i) a first stage input coupled to the input of the second processor and (ii) a second stage input coupled to the input of the first processor;
   wherein each processing stage in the first processor includes a second stage input coupled to the input of the second processor.

2. The error correcting code encoder according to claim 1, wherein each processing stage in a subset of the plurality of processing stages in the first processor includes a third stage input coupled to a stage output of a previous processing stage in the first processor; and
   wherein each processing stage in a subset of the plurality of processing stages in the second processor includes a third stage input coupled to a stage output of a previous processing stage in the second processor.

3. The error correcting code encoder according to claim 2, wherein each processing stage in the subset of the plurality of processing stages in the first processor includes a first finite field multiplier to multiply the second stage input with a corresponding first constant; and
   wherein each processing stage in the subset of the plurality of processing stages in the second processor includes a first finite field multiplier to multiply the second stage input with a corresponding first constant.

4. The error correcting code encoder according to claim 3, wherein each processing stage in the subset of the plurality of processing stages in the first processor includes a second finite field multiplier to multiply the first stage input with a corresponding second constant; and
   wherein each processing stage in the subset of the plurality of processing stages in the second processor includes a second finite field multiplier to multiply the second stage input with a corresponding second constant.

5. The error correcting code encoder according to claim 4, wherein each processing stage in the subset of the plurality of processing stages in the first processor includes a first finite field adder having a first input coupled to the third stage input and a second input coupled to an output of the first finite field multiplier; and
   wherein each processing stage in the subset of the plurality of processing stages in the second processor includes a first finite field adder having a first input coupled to the third stage input and a second input coupled to an output of the first finite field multiplier.

6. The error correcting code encoder according to claim 5, wherein each processing stage in the subset of the plurality of processing stages in the first processor includes a second finite field adder having a first input coupled to an output of the first finite field adder and a second input coupled to an output of the second finite field multiplier; and
   wherein each processing stage in the subset of the plurality of processing stages in the second processor includes a second finite field adder having a first input coupled to an output of the first finite field adder and a second input coupled to an output of the second finite field multiplier.

7. The error correcting code encoder according to claim 6, wherein each processing stage in the subset of the plurality of processing stages in the first processor includes a storage element having an input coupled to an output of the second finite field multiplier; and
   wherein each processing stage in the subset of the plurality of processing stages in the second processor includes a storage element having an input coupled to an output of the second finite field multiplier.

8. The error correcting code encoder according to claim 7, wherein each storage element in the subset of the plurality of processing stages in the first processor includes a register having a clock input coupled to a clock signal; and
   wherein each storage element in the subset of the plurality of processing stages in the second processor includes a register having a clock input coupled to the clock signal.

9. The error correcting code encoder according to claim 1, wherein the first subset of the original symbols includes even indexed symbols in an ordered sequence of the original symbols; and
   wherein the second subset of the original symbols includes odd indexed symbols in the ordered sequence of the original symbols.

10. The error correcting code encoder according to claim 9, wherein the first subset of codeword symbols includes even indexed redundant symbols in an ordered sequence of redundant symbols; and
    wherein the second subset of codeword symbols includes odd indexed redundant symbols in the ordered sequence of the redundant symbols.

11. An error correcting code encoder for generating a codeword, comprising:
    a first processor to generate a first subset of codeword symbols of the codeword based on original symbols, the first processor including a first serial input to receive a first subset of the original symbols, wherein the codeword is an encoding of the original symbols and each iteration of the first processor includes a first stage input coupled to the first serial input of the first processor; and
    a second processor to generate a second subset of codeword symbols of the codeword based on the original symbols, the second processor including (i) a second serial input to receive a second subset of the original symbols and (ii) a third serial input coupled to the first serial input of the first processor;

wherein
the first processor further includes and (ii) a fourth serial input coupled to the second serial input of the second processor, and
during each iteration, the first processor and the second processor receive different original symbols via the first serial input and the second serial input, respectively.

12. The error correcting code encoder according to claim 11, wherein the first subset of the original symbols includes even indexed symbols in an ordered sequence of the original symbols; and
wherein the second subset of the original symbols includes odd indexed symbols in the ordered sequence of the original symbols.

13. The error correcting code encoder according to claim 12, wherein the first subset of codeword symbols includes even indexed redundant symbols in an ordered sequence of redundant symbols; and
wherein the second subset of codeword symbols includes odd indexed redundant symbols in the ordered sequence of the redundant symbols.

14. The error correcting code encoder according to claim 11, wherein the first processor and the second processor are driven by a clock signal;
wherein the serial input of the first processor receives a symbol from the first subset of the original symbols each cycle of the clock signal; and
wherein the serial input of the second processor receives a symbol from the second subset of the original symbols each cycle of the clock signal.

15. The error correcting code encoder according to claim 14, wherein the codeword includes k original symbols, wherein k is a positive integer; and
wherein the first processor and the second processor generate 2t redundant symbols corresponding to the codeword in approximately k/2 clock cycles, wherein t is a positive integer.

16. The error correcting code encoder according to claim 15, wherein the codeword is a Reed-Solomon codeword.

* * * * *